US008406365B2

(12) United States Patent
Do et al.

(10) Patent No.: US 8,406,365 B2
(45) Date of Patent: *Mar. 26, 2013

(54) FREQUENCY REACQUISITION IN A CLOCK AND DATA RECOVERY DEVICE

(75) Inventors: Viet Linh Do, Carlsbad, CA (US); Mehmet Mustafa Eker, San Marcos, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 1253 days.

This patent is subject to a terminal disclaimer.

(21) Appl. No.: 12/194,744

(22) Filed: Aug. 20, 2008

(65) Prior Publication Data

US 2008/0304610 A1 Dec. 11, 2008

Related U.S. Application Data

(63) Continuation-in-part of application No. 12/120,027, filed on May 13, 2008, which is a continuation-in-part of application No. 11/717,261, filed on Mar. 12, 2007, now Pat. No. 7,560,426, and a continuation-in-part of application No. 11/954,325, filed on Dec. 12, 2007, application No. 12/194,744, which is a continuation-in-part of application No. 11/595,012, filed on Nov. 9, 2006, now Pat. No. 7,720,189.

(51) Int. Cl.
*H03D 3/24* (2006.01)

(52) U.S. Cl. ......................................... 375/376; 375/354

(58) Field of Classification Search .................. 375/376, 375/354
See application file for complete search history.

(56) References Cited

U.S. PATENT DOCUMENTS

| 5,939,948 A * | 8/1999 | Nakazawa ...................... 331/11 |
| 8,094,754 B2 * | 1/2012 | Eker et al. ..................... 375/327 |
| 8,111,785 B2 * | 2/2012 | Do et al. ........................ 375/327 |
| 2001/0027092 A1 * | 10/2001 | Muschallik et al. .......... 455/260 |
| 2003/0112907 A1 * | 6/2003 | Smith et al. ................... 375/354 |
| 2005/0024111 A1 * | 2/2005 | Ruat et al. ..................... 327/165 |

\* cited by examiner

*Primary Examiner* — Kenneth Lam
*Assistant Examiner* — Michael Neff
(74) *Attorney, Agent, or Firm* — Turocy & Watson, LLP

(57) ABSTRACT

A system and method are provided for reacquiring a non-synchronous communication signal in a clock and data recovery (CDR) device frequency synthesizer. The method initially acquires the phase of a non-synchronous communication signal having an input data frequency. In response to acquiring the phase of the input data frequency, a synthesized signal is generated having an output frequency. Also as a result of acquiring the input data frequency, a frequency ratio value is selected. The output frequency is divided by the selected frequency ratio value, creating a divisor signal having a divisor frequency, which is compared to a reference signal frequency. In response to the comparison, the frequency ratio value is saved in a tangible memory medium. In response to losing phase-lock with the communication signal, the frequency ratio value is retrieved from memory. After acquiring the input data frequency, the phase of the communication signal is reacquired.

21 Claims, 14 Drawing Sheets

| Mode | total_contribution[4:0] | total_contribution values |
|---|---|---|
| First Order | $contribution1 = c_1[n]$ | 0,1 |
| Second Order | $contribution1 + contribution2 = c_1[n] + c_2[n] - c_2[n-1]$ | -1,0,1,2 |
| Third Order | $contribution1 + contribution2 + contribution3 =$ $c_1[n] + c_2[n] - c_2[n-1] + c_3[n] - 2c_3[n-1] + c_3[n-2]$ | -3,-2,-1,0,1,2,3,4 |
| Fourth Order | $contribution1 + contribution2 + contribution3 + contribution4 =$ $c_1[n] + c_2[n] - c_2[n-1] + c_3[n] - 2c_3[n-1] + c_3[n-2] +$ $c_4[n] - 3c_4[n-1] + 3c_4[n-2] - c_4[n-3]$ | -7,-6,-5,-4,-3,-2, -1,0,1,2,3,4,5,6,7,8 |

*FIG. 2*
*(Prior Art)*

VCO Band Table with Min, Max Frequency Range

| # | Fh1 Max | Fh1 Min | # | Fh1 Max | Fh1 Min | # | Fh1 Max | Fh1 Min | # | Fh1 Max | Fh1 Min | # | Fh1 Max | Fh1 Min | 2^n |
|---|---|---|---|---|---|---|---|---|---|---|---|---|---|---|---|
| 0 | 5.44E+9 | 4.22E+9 | 1 | 4.67E+9 | 3.84E+9 | 2 | 4.35E+9 | 3.33E+9 | 3 | 3.78E+9 | 3.04E+9 | 4 | 3.46E+9 | 2.69E+9 | 5 | 2.94E+9 | 2.43E+9 | 1 |
| 6 | 2.72E+9 | 2.11E+9 | 7 | 2.34E+9 | 1.92E+9 | 8 | 2.18E+9 | 1.67E+9 | 9 | 1.89E+9 | 1.52E+9 | 10 | 1.73E+9 | 1.35E+9 | 11 | 1.47E+9 | 1.22E+9 | 2 |
| 12 | 1.36E+9 | 1.06E+9 | 13 | 1.17E+9 | 960.00E+6 | 14 | 1.09E+9 | 832.50E+6 | 15 | 945.00E+6 | 760.00E+6 | 16 | 865.00E+6 | 672.50E+6 | 17 | 735.00E+6 | 607.50E+6 | 4 |
| 18 | 680.00E+6 | 527.50E+6 | 19 | 583.75E+6 | 480.00E+6 | 20 | 543.75E+6 | 416.25E+6 | 21 | 472.50E+6 | 380.00E+6 | 22 | 432.50E+6 | 336.25E+6 | 23 | 367.50E+6 | 303.75E+6 | 8 |
| 24 | 340.00E+6 | 263.75E+6 | 25 | 291.88E+6 | 240.00E+6 | 26 | 271.88E+6 | 208.13E+6 | 27 | 236.25E+6 | 190.00E+6 | 28 | 216.25E+6 | 168.13E+6 | 29 | 183.75E+6 | 151.88E+6 | 16 |
| 30 | 170.00E+6 | 131.88E+6 | 31 | 145.94E+6 | 120.00E+6 | 32 | 135.94E+6 | 104.06E+6 | 33 | 118.13E+6 | 95.00E+6 | 34 | 108.13E+6 | 84.06E+6 | 35 | 91.88E+6 | 75.94E+6 | 32 |
| 36 | 85.00E+6 | 65.94E+6 | 37 | 72.97E+6 | 60.00E+6 | 38 | 67.97E+6 | 52.03E+6 | 39 | 59.06E+6 | 47.50E+6 | 40 | 54.06E+6 | 42.03E+6 | 41 | 45.94E+6 | 37.97E+6 | 64 |
| 42 | 42.50E+6 | 32.97E+6 | 43 | 36.48E+6 | 30.00E+6 | 44 | 33.98E+6 | 26.02E+6 | 45 | 29.53E+6 | 23.75E+6 | 46 | 27.03E+6 | 21.02E+6 | 47 | 22.97E+6 | 18.98E+6 | 128 |
| 48 | 21.25E+6 | 16.48E+6 | 49 | 18.24E+6 | 15.00E+6 | 50 | 16.99E+6 | 13.01E+6 | 51 | 14.77E+6 | 11.88E+6 | 52 | 13.52E+6 | 10.51E+6 | 53 | 11.48E+6 | 9.49E+6 | 256 |
| 54 | 10.63E+6 | 8.24E+6 | 55 | 9.12E+6 | 7.50E+6 | 56 | 8.50E+6 | 6.50E+6 | 57 | 7.38E+6 | 5.94E+6 | 58 | 6.76E+6 | 5.25E+6 | 59 | 5.74E+6 | 4.75E+6 | 512 |

Converting VCO.14 Max Freq to Max Freq Ratio

| | |
|---|---|
| Fref = | 155,520,000.0000000 |
| Rate = | 1,090,000,000.0000000 |
| 2^n = | 4 |
| PLL = | 4.360000000000000E+9 |
| VCO = | 8.720000000000000E+9 |
| Ratio = | 56.0699588477366600000 |
| N = | 56 |
| Frac = | 0.0699588477366220000 |
| FracDec = | 1173714.7 |
| Frequency Ratio To Be Inputted = | 3 8 1 1 1E 8 D 2 |

Calculate the step size for 300 ppm
42.82407407074100000 x(300/1E6) = 0.012847222222223 (dec) or
converting to 24-bit resolution is 215540.622222235271168 (dec) or
Step size = 349F 4 (hex)

Converting VCO.14 Min Freq to Min Freq Ratio

| | |
|---|---|
| Fref = | 155,520,000.0000000 |
| Rate = | 832,500,000.0000000 |
| 2^n = | 4 |
| PLL = | 3.330000000000000E+9 |
| VCO = | 6.660000000000000E+9 |
| Ratio = | 42.8240740740741000000 |
| N = | 42 |
| Frac = | 0.8240740740740760000 |
| FracDec = | 13825668.74 |
| Frequency Ratio To Be Inputted = | 2 A D 2 F 6 8 4 |

Convert to 24 bit resolution by multiply for $2^{24}$

FreqRatio_Min.14 = 2AD2F684(h)
FreqRatio_Max.14 = 3811E8D2(h)
Step_Size.14 (300ppm) = 349F4(h)

*FIG. 12*

FREQUENCY REACQUISITION IN A CLOCK AND DATA RECOVERY DEVICE

RELATED APPLICATIONS

This application is a continuation-in-part of a pending application entitled, FREQUENCY SYNTHESIS RATIONAL DIVISION, invented by Do et al., Ser. No. 12/120,027, filed May 13, 2008, which is a continuation-in-part of:

application entitled, HIGH SPEED MULTI-MODULUS PRESCALAR DIVIDER, invented by An et al., Ser. No. 11/717,261, filed Mar. 12, 2007, now U.S. Pat. No. 7,560,426 and, FLEXIBLE ACCUMULATOR FOR RATIONAL DIVISION, invented by Do et al., Ser. No. 11/954,325, filed Dec. 12, 2007.

This application is a continuation-in-part of a application entitled, SYSTEM AND METHOD FOR AUTOMATIC CLOCK FREQUENCY ACQUISITION, invented by Do et al., Ser. No. 11/595,012, filed Nov. 9, 2006, now U.S. Pat. No. 7,720,189. All the above-referenced applications are incorporated herein by reference.

BACKGROUND OF THE INVENTION

1. Field of the Invention

This invention generally relates to a phase-locked loop (PLL) frequency synthesis system and, more particularly, to a system and method for rapidly requiring the phase of a communication signal having an unknown frequency.

2. Description of the Related Art

Voltage controlled oscillators are commonly used in monolithic clock data recovery (CDR) units, as they're easy to fabricate and provide reliable results. Clock recovery PLLs generally don't use phase-frequency detectors (PFDs) in the data path since the incoming data signal isn't deterministic. PFDs are more typically used in frequency synthesizers with periodic (deterministic) signals. Clock recovery PLLs use exclusive-OR (XOR) based phase detectors to maintain quadrature phase alignment between the incoming data pattern and the re-timed pattern. XOR based phase detectors have limited frequency discrimination capability, generally restricting frequency offsets to less than the closed loop PLL bandwidth. This characteristic, coupled with the wide tuning range of the voltage controlled oscillator (VCO), requires CDR circuits to depend upon an auxiliary frequency acquisition system.

There are two basic PLL frequency acquisition techniques. The first is a VCO sweep method. During an out-of-lock condition, auxiliary circuits cause the VCO frequency to slowly sweep across its tuning range in search of an input signal. The sweeping action is halted when a zero-beat note is detected, causing the PLL to lock to the input signal. The VCO sweep method is generally used in microwave frequency synthesis applications. The second type of acquisition aid, commonly found in clock recovery circuits, uses a PFD in combination with an XOR phase detector. When the PLL is locked to a data stream, the PLL switches over to a PFD that is driven by a stable reference clock source. The reference clock frequency is proportional to the data stream rate. For example, if the data stream rate is D and the reference clock rate is R, then D α R. However, since the reference clock has only a few rate settings, it is unlikely that R is equal to the receive data rate. To create a reference equal to the data rate a fractional ratio of R must be used; such as D=n/d*R.

In this manner, the VCO frequency is held very close to the data rate. Keeping the VCO frequency in the proper range of operation facilitates acquisition of the serial data and maintains a stable downstream clock when serial data isn't present at the CDR input. When serial data is applied to the CDR, the XOR based phase detector replaces the PFD, and data re-timing resumes.

It is common for a PLL to use a divider in the feedback path, so that the PFD can operate at lower frequencies. In the simplest case, the divisor is a fixed integer value. Then, a frequency divider is used to produce an output clock that is an integer multiple of the reference clock. If the divider cannot supply the required divisor, or if the output clock is not an integer multiple of the reference clock, the required divisor may be generated by toggling between two integer values, so that an average divisor results. By placing a fractional divider (1/N) into this feedback path, a fractional multiple of the input reference frequency can be produced at the output of this fractional-N PLL.

However, it is difficult to determine a divisor, either fixed or averaged, if the frequency of the data stream is not known beforehand. For this reason, CDR devices are typically designed to operate at one or more predetermined data stream baud rates.

Conventional fractional-N frequency synthesizers use fractional number decimal values in their PLL architectures. Even synthesizers that are conventionally referred to as "rational" frequency synthesizers operate by converting a rational number, with an integer numerator and integer denominator, into resolvable or approximated fractional numbers. These frequency synthesizers do not perform well because of the inherent fractional spurs that are generated in response to the lack of resolution of the number of bits representing the divisor in the feedback path of the frequency synthesizer.

FIG. 1 is a schematic block diagram depicting an accumulator circuit capable of performing a division operation (prior art). As noted in "A Pipelined Noise Shaping Coder for Fractional-N Frequency Synthesis", by Kozak et al., IEEE Trans. on Instrumentation and Measurement, Vol. 50, No. 5, October 2001, the depicted $4^{th}$ order device can be used to determine a division ratio using an integer sequence.

The carry outs from the 4 accumulators are cascaded to accumulate the fractional number. The carry outs are combined to reduce quantization noise by adding their contributions are follows:

contribution 1=c1[n];
contribution 2=c2[n]·c2[n−1];
contribution 3=c3[n]·2c3[n−1]+c3[n−2];
contribution 4=c4[n]·3c4[n−1]+3c4[n−2]−c4[n−3];

where n is equal to a current time, and (n−1) is the previous time, Cx[n] is equal to a current value, and Cx[n−1] is equal to a previous value.

FIG. 2 shows the contributions made by the accumulator depicted in FIG. 1 with respect to order (prior art). A fractional number or fraction is a number that expresses a ratio of a numerator divided by a denominator. Some fractional numbers are rational—meaning that the numerator and denominator are both integers. With an irrational number, either the numerator or denominator is not an integer (e.g., n). Some rational numbers cannot be resolved (e.g., 10/3), while other rational numbers may only be resolved using a large number of decimal (or bit) places. In these cases, or if the fractional number is irrational, a long-term mean of the integer sequence must be used as an approximation.

The above-mentioned resolution problems are addressed with the use of a flexible accumulator, as described in parent application Ser. No. 11/954,325. The flexible accumulator is capable of performing rational division, or fractional division if the fraction cannot be sufficiently resolved, or if the fraction is irrational. The determination of whether a fraction is a rational number may be trivial in a system that transmits at a single frequency, especially if the user is permitted to select a convenient reference clock frequency. However, modern communication systems are expected to work at a number of different synthesized frequencies using a single reference clock. Further, the systems must be easily reprogrammable for different synthesized frequencies, without changing the single reference clock frequency.

As noted above, modern communication systems are expected to operate at a number of frequencies. In some circumstances the communication signal frequencies are unknown (not predetermined). While it is relatively straight-forward to reacquire the phase of a signal if the signal frequency is predetermined, it is necessarily more difficult to reacquire phase if the frequency is unknown.

It would be advantageous if a means existed for rapidly reacquiring the phase of a communication signal having an unknown frequency.

SUMMARY OF THE INVENTION

In a continuous rate CDR system, frequency ratio detection is performed after the PLL loop has been locked by a phase detector. If the CDR system is locked, the frequency range of the selected VCO band already is known. This frequency range corresponds to a calculated frequency ratio range. Therefore, it is possible to search in this frequency ratio range for the exact frequency ratio corresponding to the unknown input data rate. The frequency synthesizer can be utilized to compare a frequency reference with the frequency ratio values inside the known range to find the frequency ratio value exactly corresponding the input data rate.

Accordingly, a method is provided for reacquiring a non-synchronous communication signal in a clock and data recovery (CDR) device frequency synthesizer. The method initially acquires the phase of a non-synchronous communication signal having an input data frequency. In response to acquiring the phase of the input data frequency, a synthesized signal is generated having an output frequency. Also as a result of acquiring the input data frequency, a frequency ratio value is selected. The output frequency is divided by the selected frequency ratio value, creating a divisor signal having a divisor frequency, which is compared to a reference signal frequency. In response to the comparison, the frequency ratio value is saved in a tangible memory medium.

In response to losing phase-lock with the communication signal, the frequency ratio value is retrieved from memory. The output frequency (of the synthesizer) is divided by the frequency ratio value, creating a frequency detection signal. The frequency detection signal is compared to the reference signal frequency, and the input data frequency is acquired. After acquiring the input data frequency, the output frequency is compared to the input data frequency, and the phase of the communication signal is reacquired.

The divisor frequency is compared to the reference signal frequency by counting divisor signal cycles, creating a first count. Likewise, reference signal cycles are counted, creating a second count. The difference is found between the first and second counts and compared to a maximum threshold value.

Additional details of the above-described method and a system for reacquiring a non-synchronous communication signal in a CDR device frequency synthesizer are presented below.

BRIEF DESCRIPTION OF THE DRAWINGS

FIG. 2 shows the contributions made by the accumulator depicted in FIG. 1 with respect to order (prior art).

FIG. 12 depicts an exemplary process for converting from the VCO table to the frequency ratio table.

DETAILED DESCRIPTION

Figure 1:
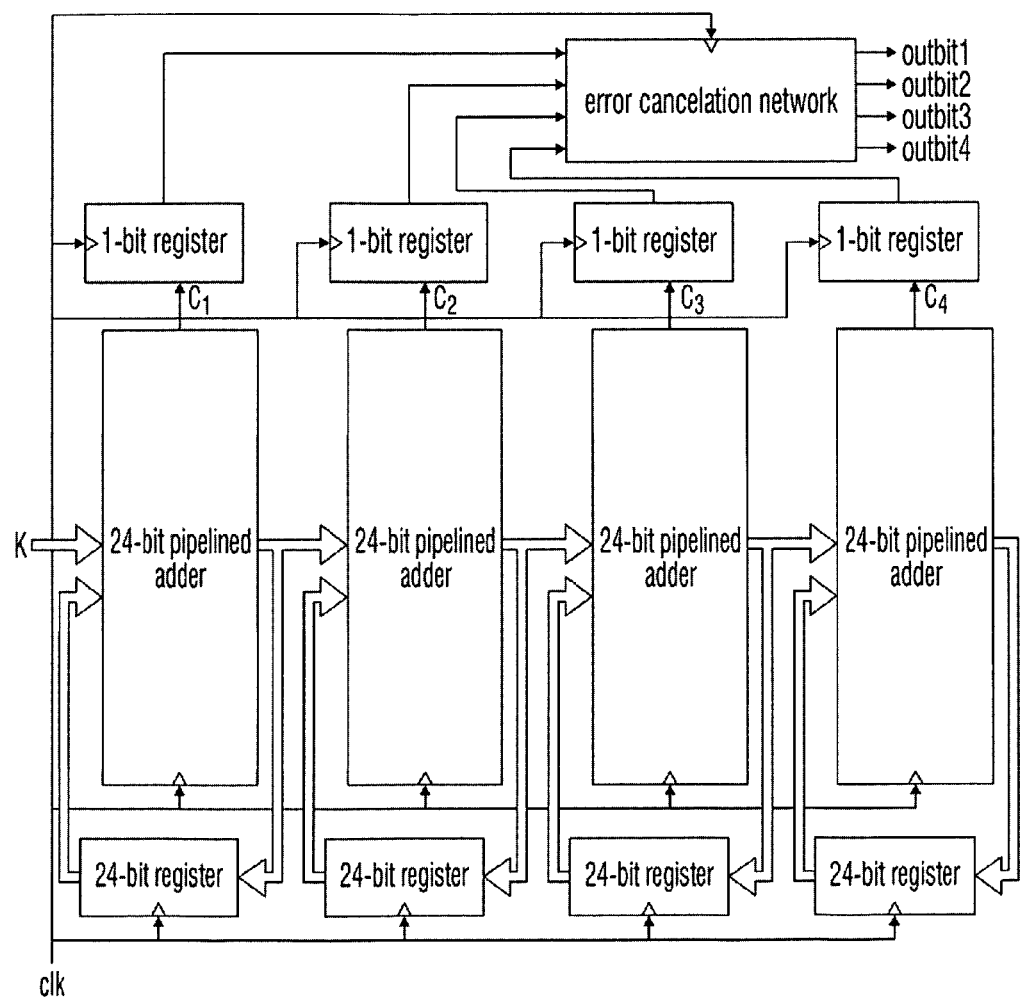
FIG. 1 is a schematic block diagram depicting an accumulator circuit capable of performing a division operation (prior art).

Various embodiments are now described with reference to the drawings. In the following description, for purposes of explanation, numerous specific details are set forth in order to provide a thorough understanding of one or more aspects. It may be evident, however, that such embodiment(s) may be practiced without these specific details. In other instances, well-known structures and devices are shown in block diagram form in order to facilitate describing these embodiments.

As used in this application, the terms "processor", "processing device", "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Various embodiments will be presented in terms of systems that may include a number of components, modules, and the like. It is to be understood and appreciated that the various systems may include additional components, modules, etc. and/or may not include all of the components, modules etc. discussed in connection with the figures. A combination of these approaches may also be used.

The various illustrative logical blocks, modules, and circuits that have been described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the node, or elsewhere. In the alternative, the processor and the storage medium may reside as discrete components in the node, or elsewhere in an access network.

Figure 3:
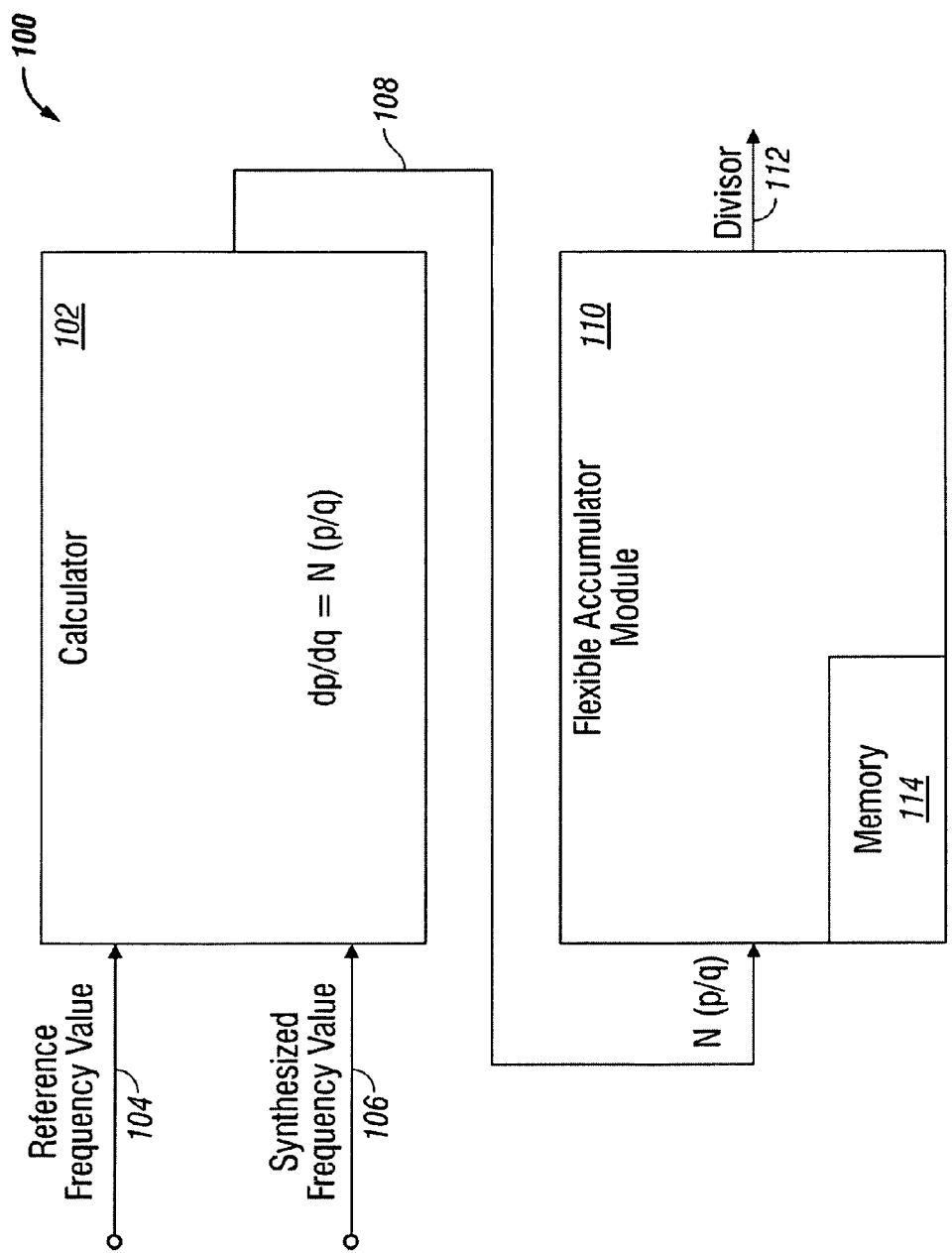
FIG. 3 is a schematic block diagram depicting a system for synthesizing signal frequencies using rational division.

FIG. 3 is a schematic block diagram depicting a system for synthesizing signal frequencies using rational division. The system 100 comprises a calculator 102 having an input on line 104 to accept a reference frequency value and an input on line 106 to accept a synthesized frequency value. The calculator 102 divides the synthesized frequency value by the reference frequency value, and determines an integer value numerator (dp) and an integer value denominator (dq). The calculator 102 reduces the ratio of dp/dq to an integer N and a ratio of p/q (dp/dq=N(p/q)), where p/q<1 (decimal). The calculator 102 supplies N(p/q), where p is a numerator and q is a denominator, at an output on line 108. A flexible accumulator module 110 has an input on line 108 to accept N(p/q) and an output on line 112 to supply a divisor. For example, the calculator 102 may supply an n-bit binary numerator and an (n+1)-bit binary denominator. The divisor may be stored in a tangible memory medium (e.g., random access memory (RAM) or non-volatile memory) for subsequent use, as described below.

Figure 4:
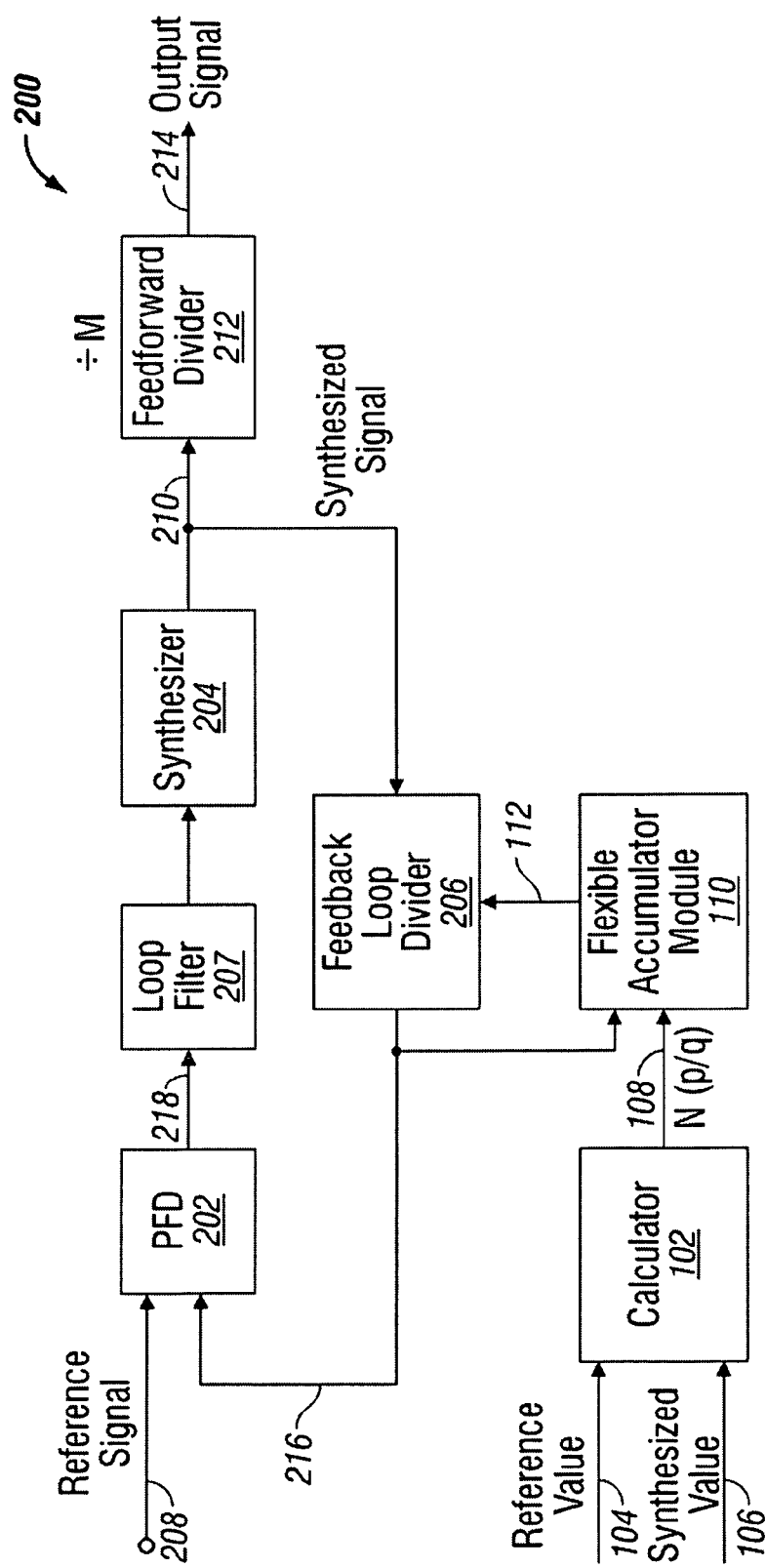
FIG. 4 is a schematic block diagram depicting the system of FIG. 3 is the context of a phase-locked loop (PLL).

FIG. 4 is a schematic block diagram depicting the system of FIG. 3 is the context of a phase-locked loop (PLL) 200. The PLL 200 includes a phase/frequency detector (PFD) 202, a frequency synthesizer 204, and a feedback loop divider 206. Typically, a PLL may also include a loop filer and charge pump 207. The PFD 202 accepts a reference signal on line 208 having a frequency equal to the reference frequency value. The frequency synthesizer 204 generates a synthesized signal on line 210 having a frequency equal to the synthesized frequency value. The flexible accumulator module 110 sums N with a k-bit quotient, creates the divisor, and supplies the divisor to the feedback loop divider 206 on line 112.

Figure 5:
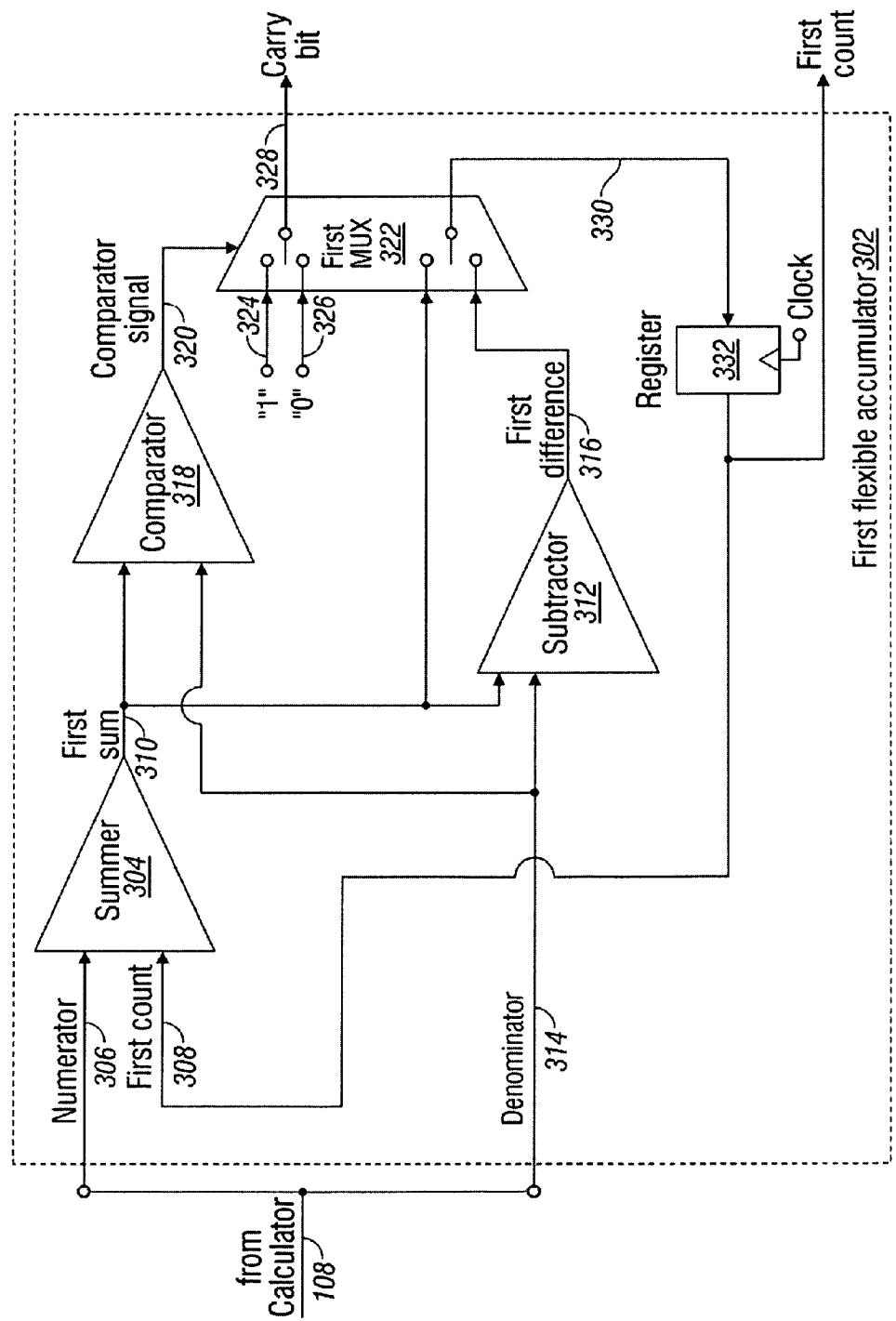
FIG. 5 is a schematic block diagram depicting a first flexible accumulator of the flexible accumulator module.

FIG. 5 is a schematic block diagram depicting a first flexible accumulator of the flexible accumulator module. A flexible accumulator is capable of either rational or fractional division. As explained in more detail below, rational division relies upon the use of a numerator (dividend) and a denominator (divisor) that are used to form a true rational number. That is, the numerator and denominator are integer inputs to the flexible accumulator. Alternately stated, the input need not be a quotient derived from a numerator and denominator. The first flexible accumulator 302 includes a first summer 304 having an input on line 306 to accept a binary numerator (p). Summer 304 has an input on line 308 to accept a binary first count from a previous cycle and an output on line 310 to supply a binary first sum of the numerator and the first count.

A first subtractor 312 has an input on line 314 to accept a binary denominator (q), an input on line 310 to accept the first sum, and an output on line 316 to supply a binary first difference between the first sum and the denominator. Note: the numerator (p) and denominator (c) on lines 306 and 314, respectively, are components of the information supplied by the calculator on line 108. A first comparator 318 has an input on line 310 to accept the first sum, an input on line 314 to accept the denominator, and an output on line 320 to supply a first comparator signal. A first multiplexer (MUX) 322 has an input to accept carry bits. A "1" carry bit is supplied on line 324 and a "0" carry bit is supplied on line 326. The MUX 322 has a control input on line 320 to accept the first comparator signal, and an output on line 328 to supply a first carry bit in response to the first comparator signal.

More explicitly, the first MUX 322 supplies a binary "1" first carry bit on line 328 if the first comparator signal on line 320 indicates that the first sum is greater than the denominator. The MUX 322 supplies a binary "0" first carry bit if the first comparator signal indicates that the first sum is less than or equal to the denominator. The first MUX 322 has an input on line 310 to accept the first sum, an input on line 316 to accept the first difference, and an output on line 330 to supply the first count in response to the comparator signal. Note: the first count from first MUX 322 on line 330 becomes the first count from a subsequent cycle on line 308 after passing through clocked register or delay circuit 332. As explained in more detail below, line 308 may also connected as an output port (count) to another, higher order flexible accumulator.

The first MUX 322 supplies the first difference as the first count on line 308 for the subsequent cycle if the first comparator signal indicates that the first sum is greater than the denominator. The first MUX 322 supplies the first sum as the first count in the subsequent cycle if the first comparator signal indicates that first sum is less than or equal to the denominator. Alternately but not shown, the accumulator may be comprised of two MUX devices, one for selecting the carry bit and one for selecting the first count.

In one aspect, the first summer accepts an n-bit binary numerator on line 306, an n-bit first count on line 308 from the previous cycle, and supplies an (n+1)-bit first sum on line 310. The first subtractor 312 accepts an (n+1)-bit binary denominator on line 314 and supplies an n-bit first difference on line 316.

Typically, first summer 304 accepts the numerator with a value, and the first subtractor 312 accepts the denominator with a value larger than the numerator value. In one aspect, the combination of the numerator and denominator form a rational number. That is, both the numerator and denominator are integers. However, the numerator and denominator need not necessarily form a rational number. Alternately expressed, the first summer 304 may accept an n-bit numerator that is a repeating sequence of binary values, or the numerator may be the most significant bits of a non-repeating sequence. The non-repeating sequence may be represented by r, an irrational number or a rational number that cannot be resolved (does not repeat) within a span of n bits. In this aspect, the first subtractor 312 accepts an (n+1)-bit denominatol with a value equal to decimal $2^{(n+1)}$. Additional details of the flexible accumulator module can be found in parent application Ser. No. 11/954,325.

Figure 6:
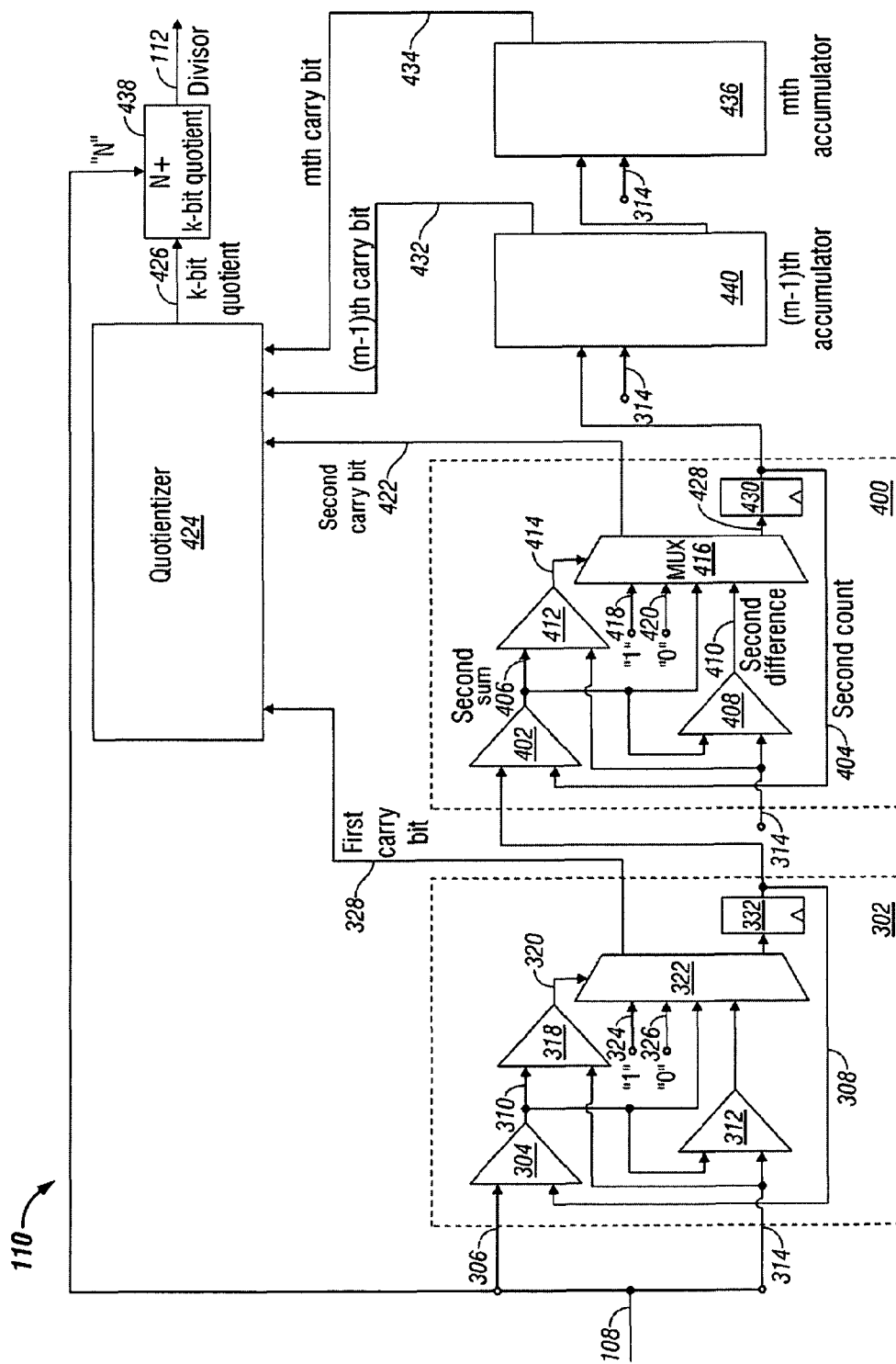
FIG. 6 is a schematic block diagram depicting the flexible accumulator module as a plurality of series-connected flexible accumulators.

FIG. 6 is a schematic block diagram depicting the flexible accumulator module as a plurality of series-connected flexible accumulators. Generally, the flexible accumulator module generates a binary sequence from each flexible accumulator and uses a plurality of binary sequences to generate the k-bit quotient.

A quotientizer 424 has an input on line 328 to accept the first binary sequence, an input on line 422 to accept the second binary sequence, and an output on line 426 to supply a k-bit quotient generated from the first and second binary sequences. In total, the flexible accumulator module 110 comprises m flexible accumulators, including an (m−1)th accumulator 440 and an mth accumulator 436. In this example, m=4. However, the module 110 is not limited to any particular number of flexible accumulators. Thus, the quotientizer has inputs 328, 422, 432, and 434 to accept m=4 binary sequences and the output 426 supplies a k-bit quotient generated from the m binary sequences. In one aspect, the quotientizer 424 derives the quotient as shown in FIGS. 1 and 2, and as explained below. Circuit 438 sums the k-bit quotient on line 426 with the integer N to supply the divisor on line 112.

A fourth order system, using four series-connected accumulators has been depicted as an example. However, it should be understood that the system is not limited to any particular number of accumulators. Although the above-described values have been defined as binary values, the system could alternately be explained in the context of hexadecimal or decimal numbers.

Figure 7:
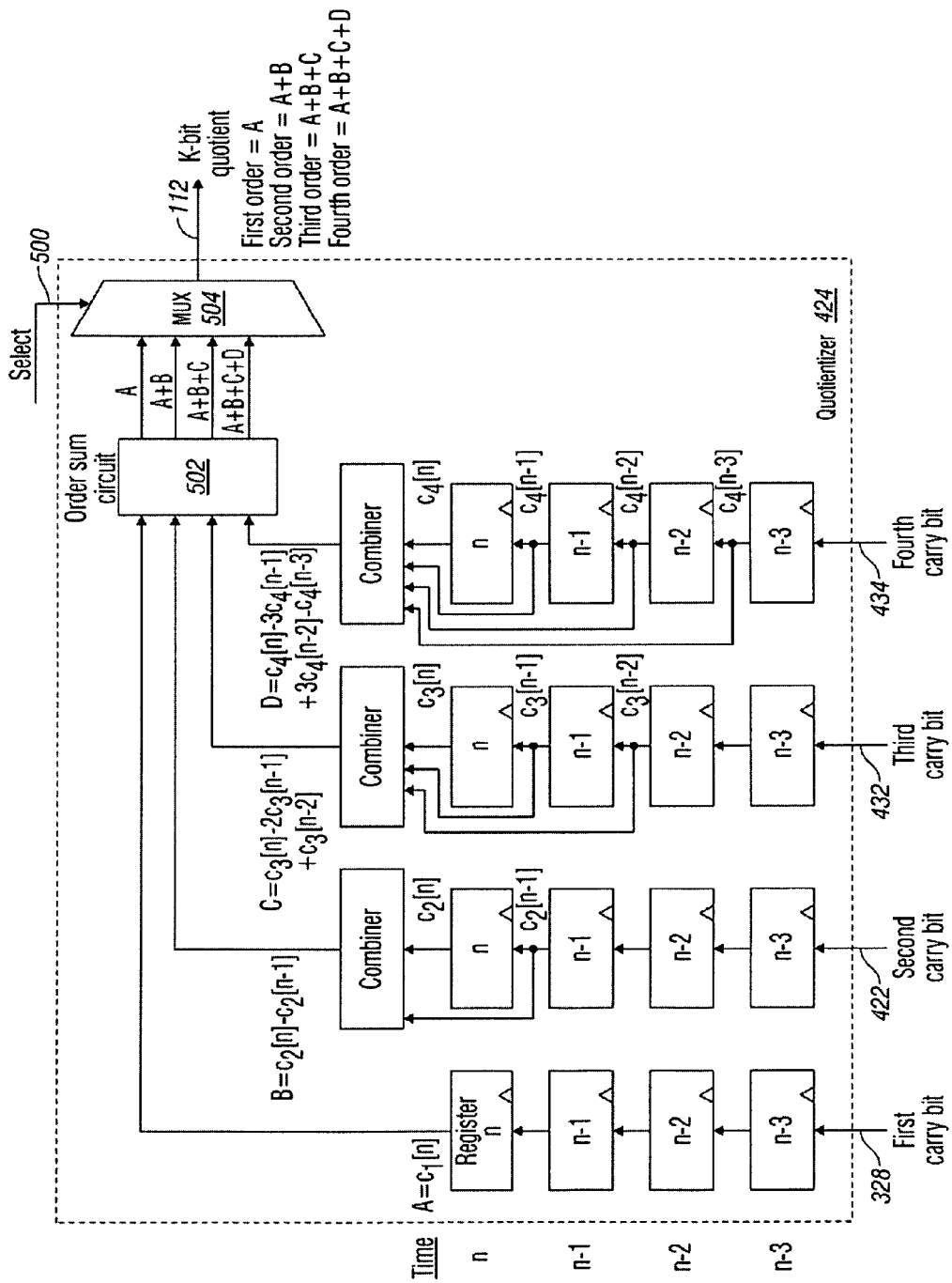
FIG. 7 is a schematic block diagram depicting the quotientizer of FIG. 6 in greater detail.

FIG. 7 is a schematic block diagram depicting the quotientizer of FIG. 6 in greater detail. Returning to the calculation of the quotient, the number of bits required from each contribution block is different. From FIG. 2 it can see that each order requires a different number of bits. For example, the first contribution (contribution 1) has only two values: 0 and 1. So, only 1 bit is needed. There is no need for a sign bit, as the value is always positive. The second contribution has possible 4 values: −1, 0, 1, and 2. So, 3 bits are needed, including 1 sign bit. The third contribution has 7 values: −3 to 4. So, 4 bits are required, including 1 sign bit. The fourth contribution has 15 values: −7 to 8. So, 5 bits are required, including 1 sign bit.

To generalize for "k" (the k-bit quotient), Pascal's formula may be used to explain how many bits is necessary for each contribution (or order). For an m-order calculator, there are m flexible accumulators and m binary sequences. Each binary sequence (or carry bit) is connected to the input of one of the m sequences of shift registers. Thus, there are m signals combined from the m shift register sequences, corresponding to the m-binary sequences (or m-th carry bit) found using Pascal's formula. A 4-order calculator is shown in FIG. 7, with 4 shift register (delay) sequences, with each shift register sequence including 4 shift registers.

As a simplified alternative, each contribution may be comprised of the same number of bits, k, which is the total contribution (or order) for all contributions. These k-bit contributions are 2 complement numbers. In FIG. 2, k is equal to 5 bits [4:0].

The accumulator does not generate a sign bit. However, the carry outs from the accumulators are modulated in the calculator and the sign bit is generated. For example, the $2^{nd}$ order contribution=c2[n]−c2[n−1]. If c2[n]=0 and c2[n−1]=1, then the $2^{nd}$ order contribution=0−1=−1. Similarly, the third order contribution=c3[n]−2c3[n−1]+c3[n−2]. If c3[n]=0, c3[n−1]=1, and c3[n−2]=0, then the 3(~1 order contribution=0−2×1+0=−2. For the $4^{th}$ order contribution=c4[n]−3c4[n−1]+3c4[n−2]−c4[n−3]. If c4[n]=0, c4[n−1]=1, c4[n−2]=0, and c4[n−3]=1, then the $4^{th}$ order contribution=0-3×1+3×0−1=−4. These contributions are added together in the "order sum circuit" 502 on the basis of order, and the order is chosen using MUX 504 and the select signal on line 500. FIG. 7 depicts one device and method for generating a quotient from accumulator carry bits. However, the system of FIG. 6 might also be enabled using a quotientizer that manipulates the accumulator carry bits in an alternate methodology.

Returning to FIG. 4, in one aspect the calculator 102 defines a resolution limit of j radix places, sets q=dq, and determines p. The calculator 102 supplies p and q to a flexible accumulator module 110 enabled for rational division when p can be represented as an integer using j, or less, radix places. Alternately, the calculator 102 supplies N(r/q) to a flexible accumulator module enabled for fractional division, where r is a non-resolvable number, when p cannot be represented as an integer using j radix places. When enabled for fractional division, r is supplied as the "numerator" on line 306 (see FIG. 5). Then, the "denominator" on line 314 is represented as an integer with a value larger than the fractional number. For example, the fractional number of line 306 may be an unresolved 31-bit binary number and the integer on line 314 may be a 32-bit number where the highest order radix place is "1" and all the lower orders are "0". Alternately stated, r may be a 31-bit non-resolvable numerator, and q a 32-bit denominator with a value equal to decimal $2^{32}$. In one aspect, r is "rounded-off" to a resolvable value.

In one aspect, the PLL 200 of FIG. 4 includes a feedforward divider 212 to accept the synthesized signal on line 210 and an output on line 214 to supply an output signal having a frequency=(synthesized signal frequency)/M. In this aspect, the flexible accumulator module 110 creates the divisor by summing N, the k-bit quotient, and M. Likewise, the calculator 102 reduces to ratio M(dp/dq)=N(p/q)).

Figure 8:
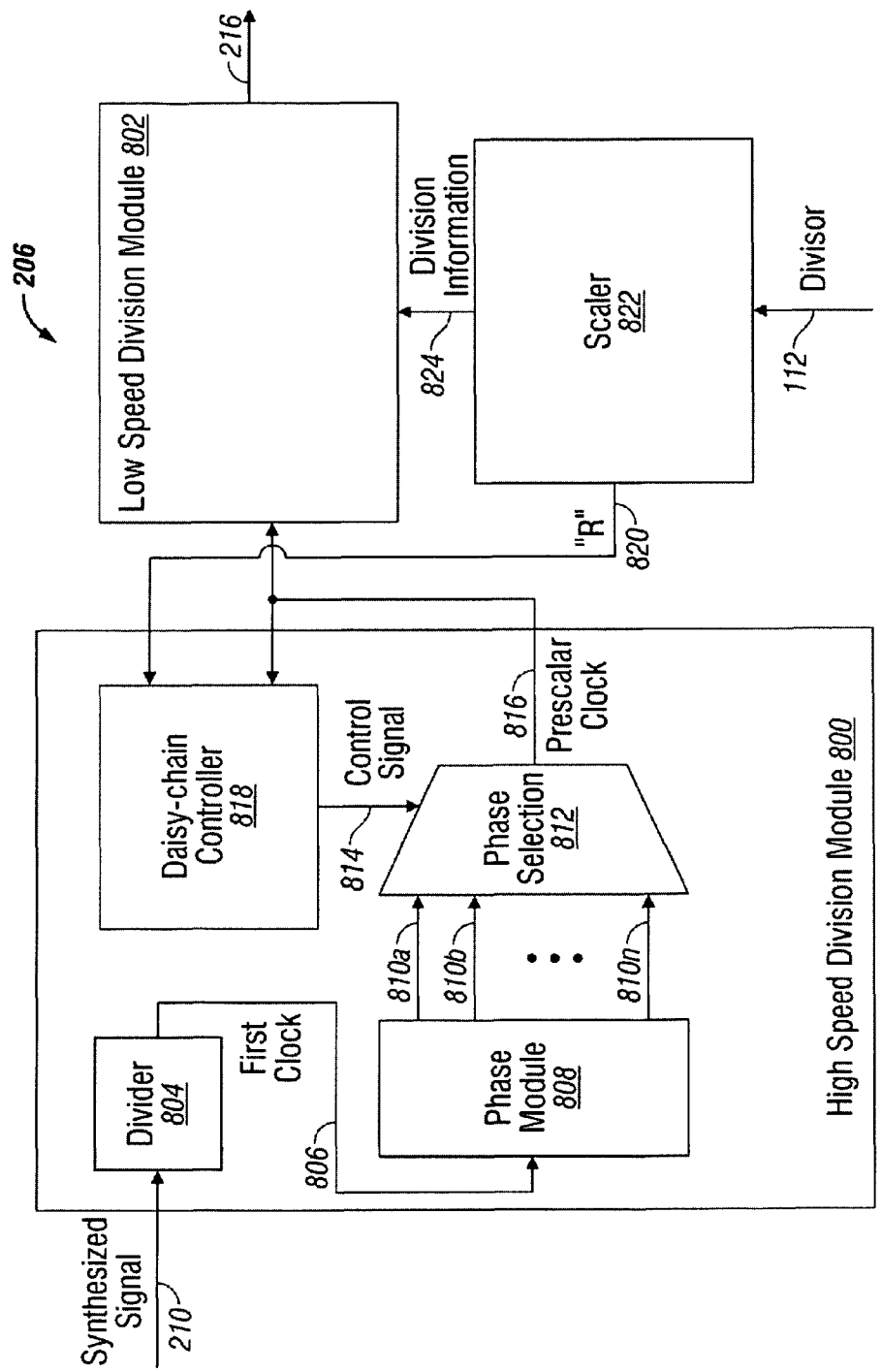
FIG. 8 is a schematic block diagram depicting the feedback loop divider of FIG. 4 is greater detail.

FIG. 8 is a schematic block diagram depicting the feedback loop divider of FIG. 4 is greater detail. The feedback loop divider 206 includes a high-speed division module 800 and a low-speed division module 802. The high-speed module 800 includes a divider 804 having an input on line 210 to accept the synthesized signal and an output on line 806 to supply a first clock signal having a frequency equal to the (synthesized signal frequency)/J. A phase module 808 has an input on line 806 to accept the first clock and an output on lines 810a through 810n to supply a plurality of phase outputs, each having the first clock frequency. Typically, the phase module 808 generates a first clock with a first number of equally-spaced phase outputs. For example, n may be equal to 8, meaning that 8 first clock signals are supplied, offset from the nearest adjacent phase by 45 degrees. A phase selection multiplexer 812 has an input on lines 810a-810n to accept the plurality of first clock phase outputs, an input on line 814 to accept a control signal for selecting a first clock signal phase, and an output on line 816 to supply a prescalar clock with a frequency equal to the (synthesized signal frequency)/R, where R=J·S.

A daisy-chain register controller 818 has an input on line 820 to accept the pre-divisor value R and an output on line 814 to supply the control signal for selecting the first clock phase outputs. A low-speed module 822 has an input on line 816 to accept the prescalar clock and an output on line 216 to supply a divided prescalar clock with a frequency equal to the (divisor/R). A scaler 822 accepts the divisor on line 112, supplies the R value of line 820, and supplies division information to the low speed divider 802 on line 824. Returning briefly to FIG. 4, the PFD 202 compares the divided prescalar clock frequency on line 216 to the reference clock frequency and generates a synthesized signal correction voltage on line 218. In some aspects, the divided prescalar clock signal on line 216 is feedback to the flexible accumulator module 110.

Figure 9:
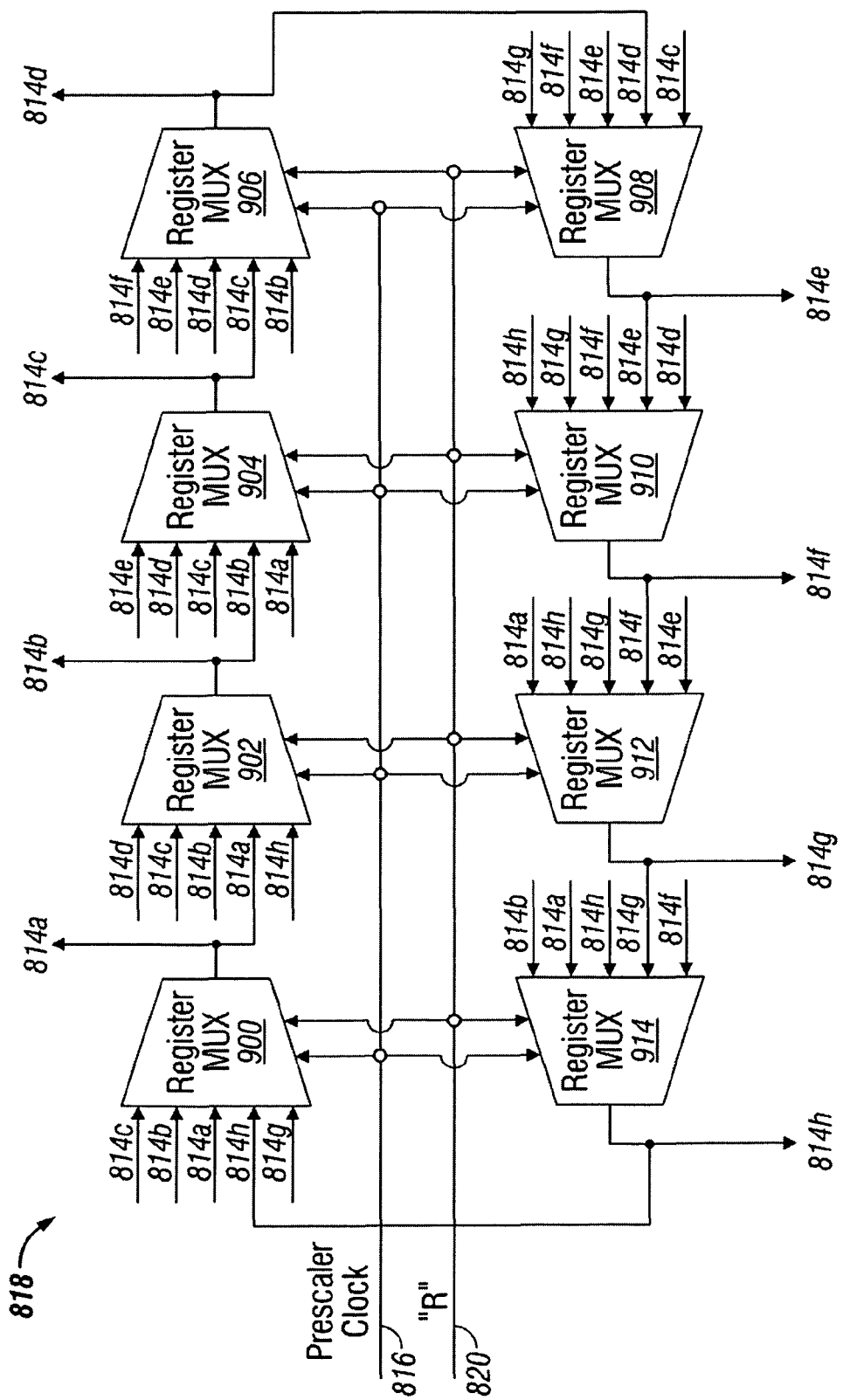
FIG. 9 is a block diagram depicting the daisy-chain controller of FIG. 8 in greater detail.

FIG. 9 is a block diagram depicting the daisy-chain controller of FIG. 8 in greater detail. The daisy-chain register controller 818 accepts the prescalar clock on line 816 as a clock signal to registers 900 through 914 having outputs connected in a daisy-chain. The controller 818 generates a sequence of register output pulses 814a through 814h in response to the clock signals, and uses the generated register output pulses to select the first clock phase outputs.

The daisy-chain register controller 818 iteratively selects sequences of register output pulses until a first pattern of register output pulses is generated. Then, the phase selection multiplexer (816, see FIG. 8) supplies phase output pulses having a non-varying first period, generating a prescalar clock frequency equal to the (first clock frequency) S, where S is either an integer or non-integer number. Additional details of the high speed divider and daisy-chain controller may be found in parent application Ser. No. 11/717,261.

Figure 10:
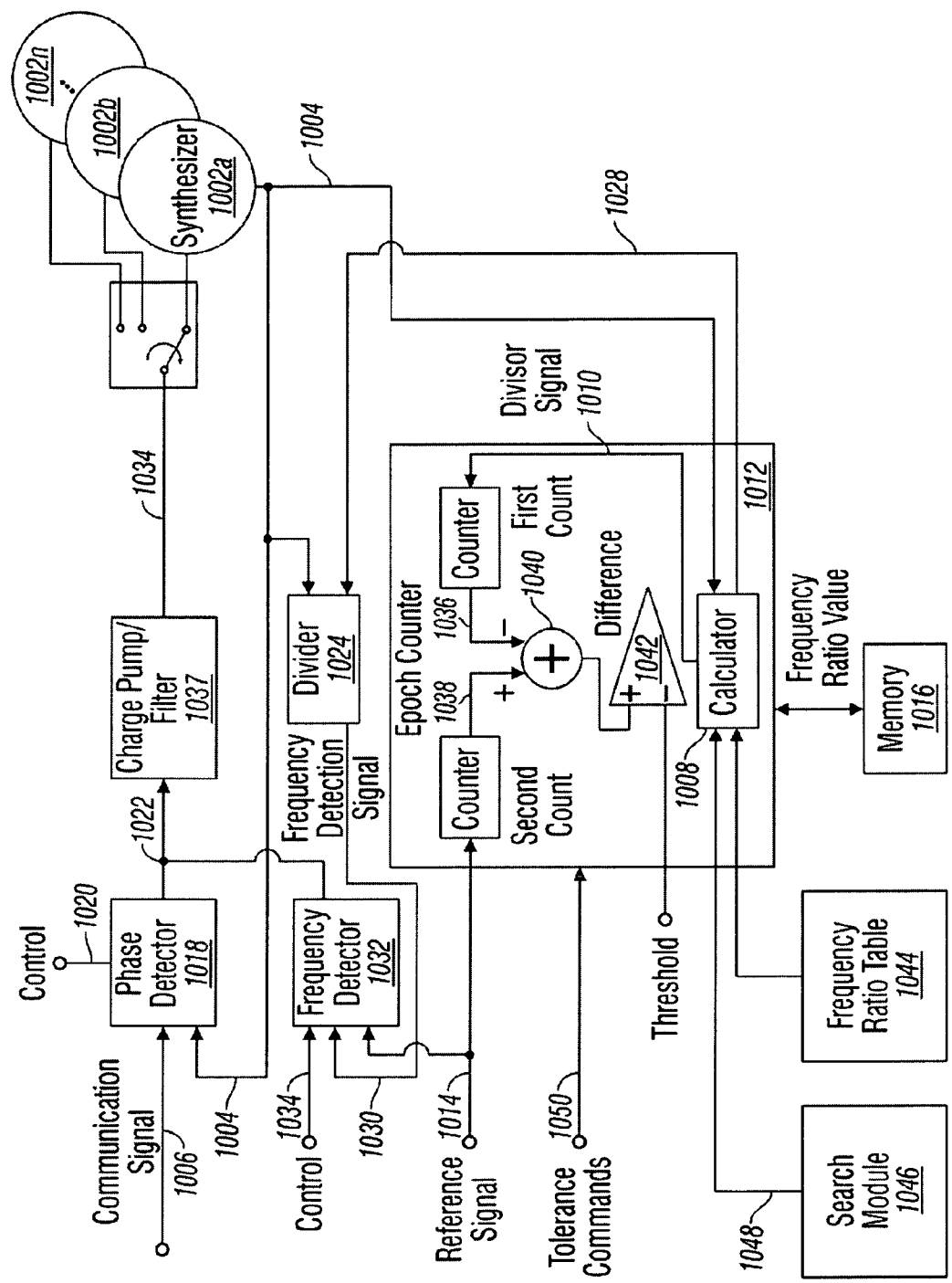
FIG. 10 is a schematic block diagram depicting a system for reacquiring a non-synchronous communication signal in a clock and data recovery (CDR) device frequency synthesizer.

FIG. 10 is a schematic block diagram depicting a system for reacquiring a non-synchronous communication signal in a clock and data recovery (CDR) device frequency synthesizer. It should be understood that aspects of the system 1000 are enabled by, or work in junction with elements of the system described above in FIGS. 3-9. System 1000 comprises a first synthesizer 1002a having an output on line 1004 to supply a synthesized signal having an output frequency locked in phase to a non-synchronous communication signal on line 1006, which has an input data frequency. A calculator module 1008 has an input to accept the synthesized signal on line 1004. The calculator module 1008 selects a frequency ratio value, divides the output frequency by the selected frequency ratio value, and supplies a divisor signal having a divisor frequency at an output on line 1010.

An epoch counter 1012 has an input on line 1010 to accept the divisor frequency and an input on line 1014 to accept a reference signal frequency. The epoch counter 1012 compares the divisor frequency to the reference signal frequency, and in response to the comparing, saves the frequency ratio value in a tangible memory medium 1016.

A phase detector 1018 is shown, selectable engaged in a phase-lock mode in response to a control signal on line 1020, with an input on line 1006 to accept the communication signal, an input on line 1004 to accept the synthesized signal, and an output on line 1022 to supply phase information. A divider 1024 is selectable engaged in a frequency acquisition mode. The divider has an input on line 1028 to accept the frequency ratio value, an input on line 1004 to accept the synthesized signal output frequency, and an output on line 1030 to supply a frequency detection signal equal to the output frequency divided by the frequency ratio value.

A frequency detector 1032 is selectable engaged in the frequency acquisition inode, responsive to a control signal on line 1034. The frequency detector has an input on line 1014 to accept the reference signal frequency, an input on line 1030 to accept the frequency detection signal, and an output on line 1022 to supply frequency information. Thus, the first synthesizer 1002a has an input on line 1034 to accept either phase information in the phase-lock mode or frequency information in the frequency acquisition mode. Also shown is a charge pump/filter 1037 interposed between lines 1022 and 1034.

The epoch counter 1012 retrieves the frequency ratio value from memory 1016 for supply to the divider 1024, in response to a lose of lock between the synthesized signal and the communication signal in the phase-lock mode, triggering the frequency acquisition mode.

The phase detector 1018 compares the communication signal on line 1006 to the synthesized signal on line 1004 in the phase-lock mode and reacquires the phase of the communication signal, subsequent to frequency detector 1032 (re) acquiring the input data frequency of the communication signal in the frequency acquisition mode.

The calculator 1008 selects a frequency ratio value equal to the output frequency divided by the reference frequency. The epoch counter 1012 compares the divisor frequency to the reference signal frequency by counting divisor signal cycles and creating a first count on line 1036. The epoch counter 1012 also counts reference signal cycles and creates a second count on line 1038. The epoch counter 1012 finds the difference between the first and second counts, as represented by summing circuit 1040, and compares the difference to a maximum threshold value input, as represented using comparator 1042.

In one aspect, the epoch counter 1012 compares the difference to the maximum threshold value by ending a coarse search for a frequency ratio value if the difference is less than the maximum threshold value, and reselects a frequency ratio value if the difference is greater than the maximum threshold value. The calculator 1008 selects the frequency ratio value by accessing a range of frequency ratio values corresponding to a range of output frequencies from table 1044. For example, the calculator 1008 selects a first frequency ratio value from the range of frequency ratio values, and reselects the frequency ratio value by selecting a second frequency value from the range of frequency ratio values in table 1044.

In one aspect, a search module 1046 has an output on line 1048 to supply search algorithm commands based upon a criteria such as step size, step origin, step direction: and combinations of the above-mentioned criteria. The calculator 1008 selects the first and second frequency ratio values in response to the search algorithm commands accepted at an input on line 1048.

In one aspect, the epoch counter 1012 compares the divisor frequency to the reference signal frequency by creating first and second counts with respect to a first time duration, and subsequent to ending the coarse search, initiates a fine search by creating first and second counts with respect to a second time duration, longer than the first time duration. In other words, the fine search uses a longer time period to collect a greater number of counts for comparison.

In another aspect, the epoch counter 1012 has an input on line 1050 to accept tolerance commands for selecting the maximum threshold value. Then, the calculator 1008 reselects a frequency ratio value if the difference is greater than the selected maximum tolerance value.

In one aspect, the system 1000 includes a plurality of synthesizers each having a unique output frequency band. Shown are synthesizers 1002a, 1002b, and 1002n, where n is not limited to any particular value. The first synthesizer 1002a is selected from the plurality of synthesizers prior to the frequency detector acquiring the communication signal input data frequency in the frequency acquisition mode. If the system cannot acquire the input data frequency using the first synthesizer 1002a, then second synthesizer 1002b may be selected, until a synthesizer is found that can be locked to the input data frequency.

Although the above-described systems have been depicted as a combination of connected hardware elements, some aspects parts of the system may be enabled using software instructions stored in memory that are called and performed by a processor or logic-coded state machine device (not shown).

Functional Description

Figure 11:
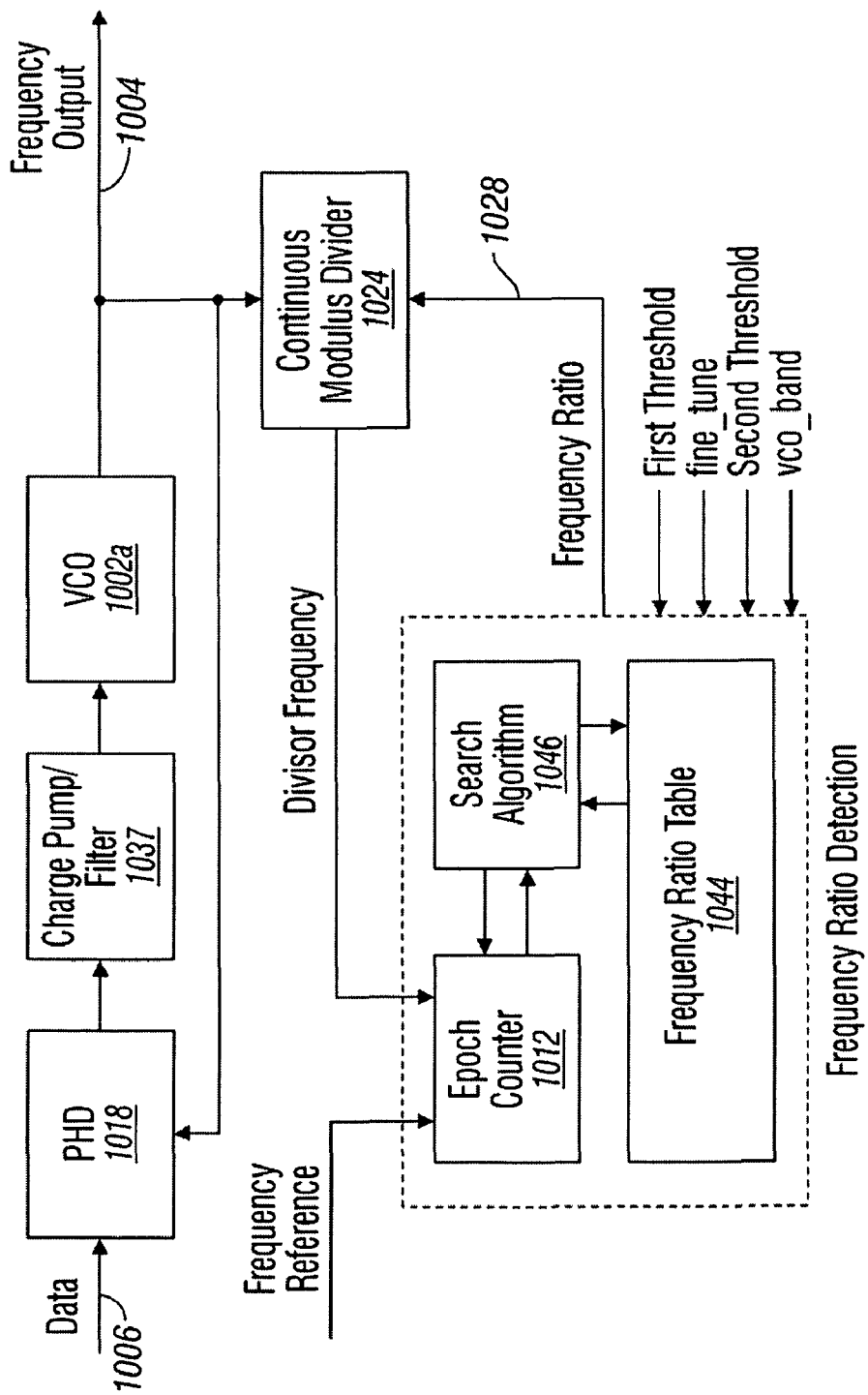
FIG. 11 is a schematic diagram depicting the system of FIG. 10 from an alternate perspective.

FIG. 11 is a schematic diagram depicting the system of FIG. 10 from an alternate perspective. Three important blocks in the system are the epoch counter 1012, the frequency ratio table 1044, and search algorithm module 1046. The epoch counter and calculator (not shown) are used to accumulate and to compare the reference frequency to the divisor frequency. The frequency ratio table 1044 is created as a result of converting from a VCO band frequency range table.

FIG. 12 depicts an exemplary process for converting from the VCO table to the frequency ratio table. Band 14, for example, has a minimum frequency of 832.50 MHz and the maximum frequency of 1.09 GHz. These frequency band corresponds to a min frequency ratio of 2AD2F684(h) and the max frequency ratio of 3811E8D2(h). To support the search algorithm and the frequency accuracy requirement, a step size is also calculated with a predetermined parts per million (ppm) requirement. In this example, 300 ppm is used for calculating the step size of 349F4(h).

Figure 13:
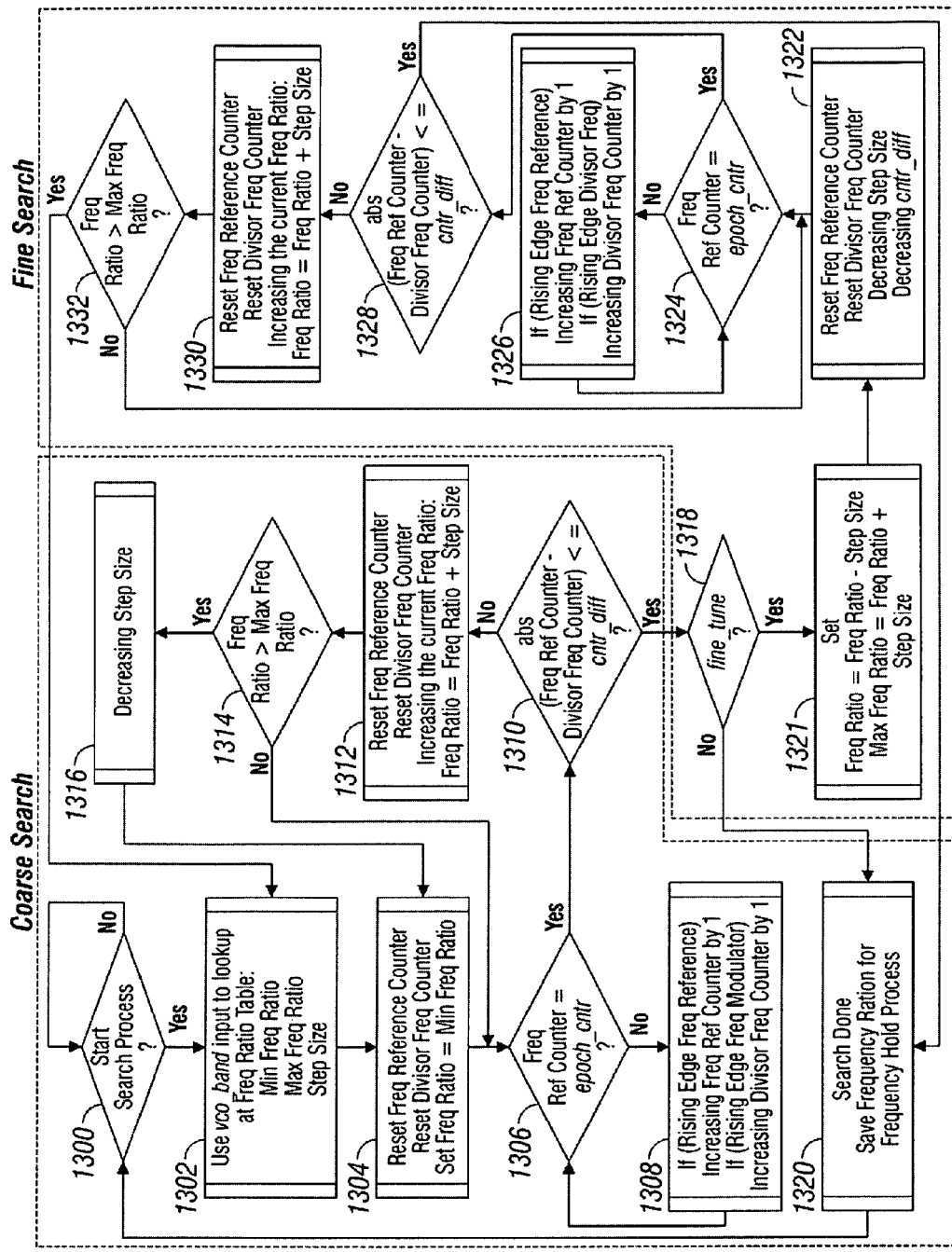
FIG. 13 is a flowchart illustrating a frequency ratio search with two search processes: Coarse Search and Fine Search.

FIG. 13 is a flowchart illustrating a frequency ratio search with two search processes: Coarse Search and Fine Search. The search algorithm implements a simple search by sweeping the min frequency ratio to the max frequency ratio by step size increments. This exemplary search algorithm is used to demonstrate the search concept. However, other search algorithms are known that would enable the frequency ratio table.

The search begins at Step 1300. In Step 1302 the VCO table is accessed. In Step 1304 the counters are reset. In Step 1306, the reference frequency counter is compared to a first threshold. If the reference frequency counter is not equal, the counters are incremented in Step 1308 and the process returns to Step 1300. Otherwise, the difference between counters is calculated in Step 1310 and compared to a second threshold. If the difference is greater than the threshold, the counters are reset in Step 1312 and the frequency ratio steps to a new value inside the frequency ratio range. If the new frequency ratio is less than the maximum value inside the range (Step 1314), the process returns to Step 1304. Otherwise, the step size is decreased (Step 1316) and the process returns to Step 1302.

If the difference between the reference frequency and divisor frequency counters are less than, or equal to the second threshold, the process goes to Step 1318. If fine tuning is not to be preformed, the search is finished (Step 1320). Steps 1322 through 1332 are essentially the same as Steps 1304 through 1314, respectively, except that the step value and second threshold value are decreased for the process of fine tuning.

Figure 14:
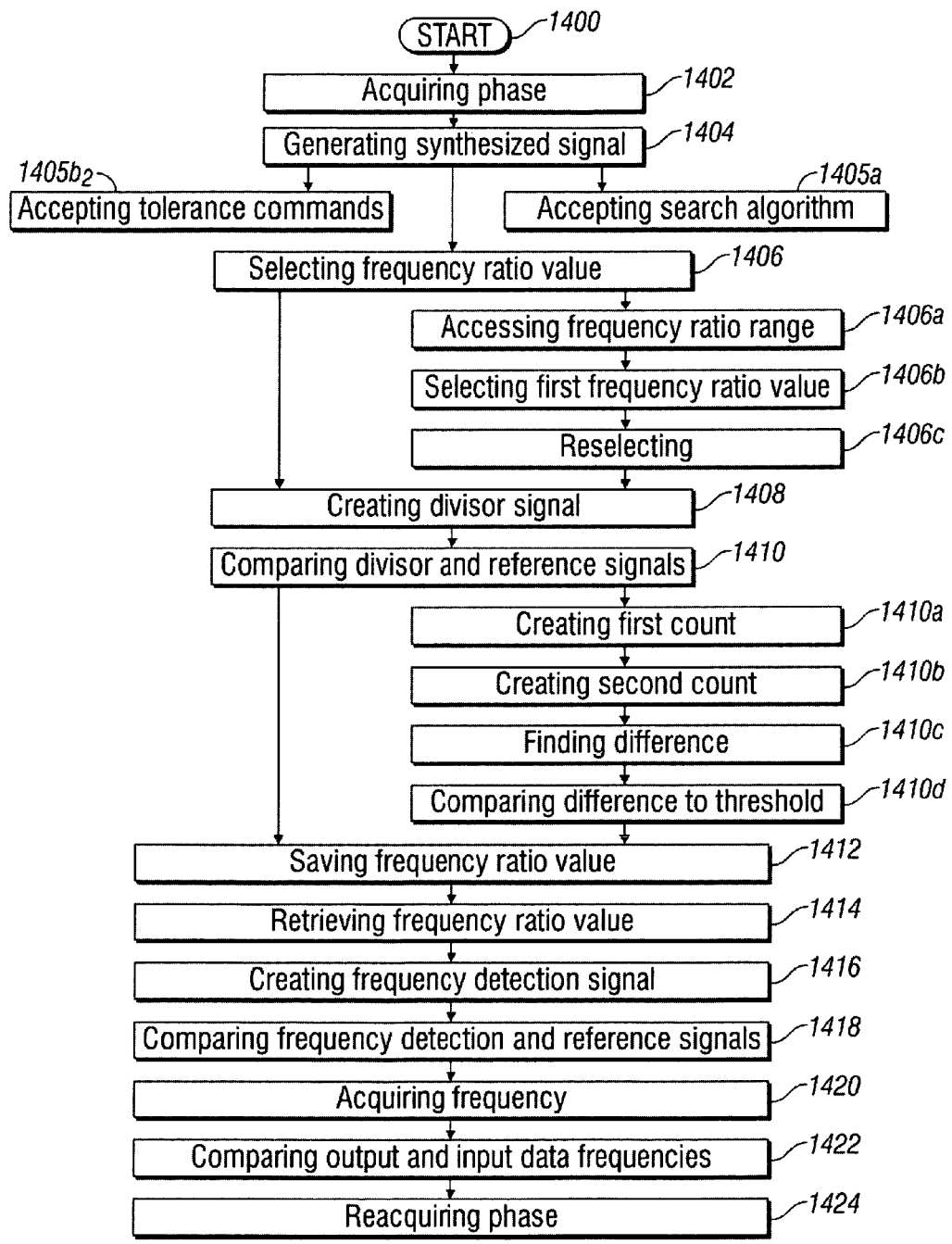
FIG. 14 is a flowchart illustrating a method for reacquiring a non-synchronous communication signal in a CDR device frequency synthesizer.

FIG. 14 is a flowchart illustrating a method for reacquiring a non-synchronous communication signal in a CDR device frequency synthesizer. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1400.

Step 1402 acquires the phase of a non-synchronous communication signal having an input data frequency. In response to acquiring the phase of the input data frequency, Step 1404 generates a synthesized signal having an output frequency. Also as a result of acquiring phase, Step 1406 selects a frequency ratio value. More explicitly, a frequency ratio value is selected that is the output frequency divided by a reference frequency. Step 1408 divides the output frequency by the selected frequency ratio value, creating a divisor signal having a divisor frequency. Step 1410 compares the divisor frequency to the reference signal frequency. In response to the comparing, Step 1412 saves the frequency ratio value in a tangible memory medium.

At a later time Step 1414 retrieves the frequency ratio value from memory, in response to losing phase-lock with the communication signal. Step 1416 divides the output frequency by the frequency ratio value, creating a frequency detection signal. Step 1418 compares the frequency detection signal to the reference signal frequency. In one aspect, comparing the frequency detection signal to the reference signal frequency in Step 1418 includes initially selecting a synthesized signal source from a plurality of synthesized signal sources, each having a unique output frequency band. Step 1420 acquires the input data frequency of the communication signal. Subsequent to acquiring the input data frequency of the communication signal, Step 1422 compares the output frequency to the input data frequency and reacquires the phase of the communication signal in Step 1424.

In one aspect, comparing the divisor frequency to the reference signal frequency in Step 1410 includes substeps. Step 1410a counts divisor signal cycles, creating a first count. Step 1410b counts reference signal cycles, creating a second count. Step 1410c finds the difference between the first and second counts, and Step 1410d compares the difference to a maximum threshold value. In some aspects, Step 1410d compares the difference to the maximum threshold value by ending a coarse search for a frequency ratio value if the difference is less than the maximum threshold value, and reselects a frequency ratio value if the difference is greater than the maximum threshold value.

In another aspect, selecting the frequency ratio value in Step 1406 includes substeps. Step 1406a accesses a range of frequency ratio values corresponding to a range of output frequencies. Step 1406b selects a first frequency ratio value from the range of frequency ratio values, and Step 1406c reselects a frequency ratio value if the difference is greater than the maximum threshold value by selecting a second frequency value from the range of frequency ratio values.

In a different aspect, Step 1405a accepts search algorithm commands based upon criteria such as step size, step origin, step direction, and combinations of the above-mentioned criteria. Then, reselecting a frequency ratio value in Step 1406c includes selecting first and second frequency ratio values in response to the search algorithm commands. In another aspect, Step 1405b accepts tolerance commands for selecting the maximum threshold value, and Step 1406c reselects a frequency ratio value if the difference is greater than the selected maximum tolerance value.

In one aspect, comparing the divisor frequency to the reference signal frequency in Step 1410 includes creating first and second counts with respect to a first time duration. Then, subsequent to ending the coarse search, Step 1410 initiates a fine search by creating first and second counts with respect to a second time duration, longer than the first time duration.

A system and method have been provided for reacquiring a non-synchronous communication signal in a CDR device frequency synthesizer. Some examples of circuitry and methodology steps have been given as examples to illustrate the invention. However, the invention is not limited to merely these examples. Other variations and embodiments of the invention will occur to those skilled in the art.

We claim:

1. A method for reacquiring a non-synchronous communication signal, comprising:
   selecting a frequency ratio value having a non-predetermined value;
   acquiring a phase of a non-synchronous communication signal having a non-predetermined input data frequency;
   in response to acquiring the phase of the input data frequency, generating a synthesized signal having an output frequency;
   dividing the output frequency by the selected frequency ratio value, creating a divisor signal having a divisor frequency;
   comparing the divisor frequency to a reference signal frequency;
   in response to losing phase-lock with the non-synchronous communication signal, dividing the output frequency by the selected frequency ratio value and creating a frequency detection signal;
   comparing the frequency detection signal to the reference signal frequency; and
   acquiring the input data frequency of the non-synchronous communication signal.

2. The method of claim 1 further comprising:
   subsequent to acquiring the input data frequency of the non-synchronous communication signal, comparing the output frequency to the input data frequency; and,
   reacquiring the phase of the non-synchronous communication signal.

3. The method of claim 1 wherein selecting the frequency ratio value comprises selecting a frequency ratio value of the output frequency divided by the reference signal frequency.

4. The method of claim 3 wherein comparing the divisor frequency to the reference signal frequency includes:
   counting divisor signal cycles, creating a first count;
   counting reference signal cycles, creating a second count;
   finding a difference between the first and second counts; and,
   comparing the difference to a maximum threshold value.

5. The method of claim 4 wherein comparing the difference to the maximum threshold value comprises:
   ending a coarse search for a frequency ratio value if the difference is less than the maximum threshold value; and,
   reselecting a frequency ratio value if the difference is greater than the maximum threshold value.

6. The method of claim 5 wherein selecting the frequency ratio value comprises:
   accessing a range of frequency ratio values corresponding to a range of output frequencies;
   selecting a first frequency ratio value from the range of frequency ratio values; and,
   wherein reselecting a frequency ratio value if the difference is greater than the maximum threshold value comprises selecting a second frequency value from the range of frequency ratio values.

7. The method of claim 6 further comprising:
   accepting search algorithm commands selected from a criterion group comprising step size, step origin, step direction, or combinations of the above-mentioned criteria;
   wherein reselecting a frequency ratio value if the difference is greater than the maximum threshold value comprises selecting first and second frequency ratio values in response to the search algorithm commands.

8. The method of claim 5 further comprising:
   accepting tolerance commands for selecting the maximum threshold value; and,
   wherein reselecting the frequency ratio value if the difference is greater than the maximum threshold value comprises reselecting the frequency ratio value if the difference is greater than the selected maximum tolerance value.

9. The method of claim 5 wherein comparing the divisor frequency to the reference signal frequency includes creating first and second counts with respect to a first time duration; and,
   the method further comprising:
   subsequent to ending the coarse search, initiating a fine search by creating first and second counts with respect to a second time duration, longer than the first time duration.

10. The method of claim 1 wherein comparing the frequency detection signal to the reference signal frequency comprises initially selecting a synthesized signal source from a plurality of synthesized signal sources, each having a unique output frequency band.

11. A system for reacquiring a non-synchronous communication signal, comprising:
    a first synthesizer having an output configured to supply a synthesized signal having an output frequency locked in phase to a non-synchronous communication signal having a non-predetermined input data frequency;
    a calculator module having an input configured to accept the synthesized signal, the calculator module selecting a frequency ratio value having a non-predetermined value, dividing the output frequency by the selected frequency ratio value, and supplying a divisor signal having a divisor frequency at an output;
    an epoch counter having inputs configured to accept the divisor frequency and a reference signal frequency, the epoch counter comparing the divisor frequency to the reference signal frequency;
    a divider, selectable engaged in a frequency acquisition mode, having an input configured to accept the selected frequency ratio value, an input configured to accept the synthesized signal output frequency, and an output configured to supply a frequency detection signal equal to the output frequency divided by the frequency ratio value; and
    a frequency detector, selectively engaged in the frequency acquisition mode, with an input configured to accept the reference signal frequency, an input configured to accept the frequency detection signal, and an output configured to supply frequency information from a comparison of the frequency detection signal and the reference signal frequency;
    wherein the epoch counter, in response to a loss of lock between the synthesized signal and the communication signal in the phase-lock mode, triggers the frequency acquisition mode.

12. The system of claim 11 further comprising:
    a phase detector, selectable engaged in a phase-lock mode, with an input configured to accept the non-synchronous communication signal, an input configured to accept the synthesized signal, and an output configured to supply phase information;
    wherein the first synthesizer has an input configured to accept information selected from a group consisting of phase information in the phase-lock mode and frequency information in the frequency acquisition mode.

13. The system of claim 12 wherein the phase detector compares the communication signal to the synthesized signal in the phase-lock mode and reacquires the phase of the communication signal, subsequent to frequency detector acquiring the input data frequency of the communication signal in the frequency acquisition mode.

14. The system of claim 11 wherein the calculator module selects a frequency ratio value equal to the output frequency divided by the reference signal frequency.

15. The system of claim 14 wherein the epoch counter compares the divisor frequency to the reference signal frequency by counting divisor signal cycles and creating a first count, counting reference signal cycles and creating a second count, finding a difference between the first and second counts, and comparing the difference to a maximum threshold value input.

16. The system of claim 15 wherein the epoch counter compares the difference to the maximum threshold value by ending a coarse search for a frequency ratio value if the difference is less than the maximum threshold value; and,
wherein the calculator module reselects a frequency ratio value if the difference is greater than the maximum threshold value.

17. The system of claim 16 wherein the calculator module selects the frequency ratio value by accessing a range of frequency ratio values corresponding to a range of output frequencies, and selects a first frequency ratio value from the range of frequency ratio values; and,
wherein the calculator module reselects the frequency ratio value by selecting a second frequency value from the range of frequency ratio values.

18. The system of claim 17 further comprising:
a search module having an output configured to supply search algorithm commands selected from a criterion group comprising step size, step origin, step direction, or combinations of the above-mentioned criteria; and,
wherein the calculator module selects first and second frequency ratio values in response to the search algorithm commands accepted at an input.

19. The system of claim 16 wherein the epoch counter has an input configured to accept tolerance commands for selecting the maximum threshold value; and,
wherein the calculator module reselects a frequency ratio value if the difference is greater than the selected maximum tolerance value.

20. The system of claim 16 wherein the epoch counter compares the divisor frequency to the reference signal frequency by creating first and second counts with respect to a first time duration, and subsequent to ending the coarse search, initiates a fine search by creating first and second counts with respect to a second time duration, longer than the first time duration.

21. The system of claim 12 further comprising:
a plurality of synthesizers, each having a unique output frequency band; and,
wherein the first synthesizer is selected from the plurality of synthesizers prior to the frequency detector acquiring the non-synchronous communication signal input data frequency in the frequency acquisition mode.

* * * * *